United States Patent [19]
Furuyama

[11] Patent Number: 5,525,820
[45] Date of Patent: Jun. 11, 1996

[54] SEMICONDUCTOR MEMORY CELL

[75] Inventor: Tohru Furuyama, Tokyo, Japan

[73] Assignee: Kabushiki Kaisha Toshiba, Kawasaki, Japan

[21] Appl. No.: 284,274

[22] Filed: Aug. 2, 1994

Related U.S. Application Data

[63] Continuation of Ser. No. 687,687, Apr. 19, 1991, abandoned.

[30] Foreign Application Priority Data

Apr. 20, 1990 [JP] Japan ................................. 2-104576

[51] Int. Cl.$^6$ ................................................ H01L 27/108
[52] U.S. Cl. .......................... 257/296; 257/297; 257/306; 365/149; 365/182
[58] Field of Search ........................ 357/23.6; 365/182, 365/73, 75, 187, 188, 102, 149; 257/296, 297, 306, 307, 308, 309, 313

[56] References Cited

U.S. PATENT DOCUMENTS

| | | | |
|---|---|---|---|
| 3,763,480 | 10/1973 | Weimer | 340/173 R |
| 4,070,590 | 1/1978 | Ieda et al. | 307/355 |
| 4,255,945 | 9/1980 | Kuo | 365/149 |
| 4,593,382 | 6/1986 | Fujishima et al. | 365/149 |

(List continued on next page.)

FOREIGN PATENT DOCUMENTS

| | | |
|---|---|---|
| 0157051 | 10/1985 | European Pat. Off. . |
| 0273639 | 7/1988 | European Pat. Off. . |

(List continued on next page.)

OTHER PUBLICATIONS

Ohta, K., et al. "Quadruply Self–Aligned Stacked High–Capacitance RAM . . . " IEEE Trans on Elec. Dev. vol. ED–29 No. 3, Mar. 1982 pp. 368–376.

Kimura, et al., "A Block–Oriented RAM with Half–Sized DRAM Cell and Quasi–Folded Data–Line Architecture," ISSCC 91, pp. 106–107, Feb. 14, 1991.

Arimoto et al., "A Circuit Design of Intelligent CDRAM with automatic Write Back Capability", 1990 Symposium on VLSI Circuits, Digest of Technical Papers, pp. 79–80.

Shah et al., "A 4Mb DRAM with Cross–point Trench Transistor Cell", 1986 ISSCC Digest of Technical Papers, pp. 268–269.

Ema et al., "3–Dimensional Stacked Capacitor Cell for 16M and 64M DRAMs", 1988 IEDM Technical Digest, pp. 592–595.

Watanabe et al., "Stacked Capacitor Cells for High–density dynamic RAMs", 1988 IEDM Technical Digest, pp. 600–603.

Sunouchi et al., "A Surrounding Gate Transistor (SGT) Cell for 64/256 MBit DRAMS", 1989 IEDM Technical Digest, pp. 23–26.

Fujishima et al., "A Storage–Node–Boosted RAM with Word–Line Delay Compensation", IEEE Journal of Solid State Circuits, vol. SC–17, No. 5, pp. 872–875, Oct. 1982.

Ohta et al., "A Novel Memory Cell Architecture for High––Density DRAMs", 1989 Symposium of VLSI Circuits, Digest of Tech. Papers, pp. 101–102.

Asakura et al., "Cell–Plate Line Connecting Complementary Bitline (C3) Architecture for Battery Operating DRAMs", 1991 Symposium on VLSI Circuits, pp. 59–60, May 30, 1991.

Kimura et al., "A Block–Oriented RAM with Half–Sized DRAM Cell and Quasi–Folded Data–line Architecture", ISSCC 91, Slide Supplement, pp. 70–71.

*Primary Examiner*—Sara W. Crane
*Attorney, Agent, or Firm*—Banner & Allegretti, Ltd.

[57] ABSTRACT

A semiconductor memory cell of the present invention comprises a cascade gate including a plurality of cascade-connected MOS transistors and having one end connected to a read/write node, and a plurality of capacitors for information storage connected at one end to said MOS transistors, respectively, at the end remote from said node.

57 Claims, 5 Drawing Sheets

U.S. PATENT DOCUMENTS

| | | | |
|---|---|---|---|
| 4,648,073 | 3/1987 | Kenney | 365/149 |
| 4,669,063 | 5/1987 | Kirsch | 365/189 |
| 4,758,987 | 7/1988 | Sakui | 365/189 |
| 4,943,944 | 7/1990 | Sakui et al. | 365/189.05 |
| 4,980,863 | 12/1990 | Ogihara | 365/205 |
| 5,025,294 | 6/1991 | Ema | 357/23.6 |
| 5,051,954 | 9/1991 | Toda et al. | 365/189.02 |
| 5,079,746 | 1/1992 | Sato | 365/225.7 |
| 5,091,761 | 2/1992 | Hiraiwa et al. | 357/23.6 |
| 5,091,885 | 2/1992 | Ohsawa | 365/203 R |
| 5,172,198 | 12/1992 | Aritome et al. | 257/315 |
| 5,184,326 | 2/1993 | Hoffmann et al. | 365/201 |

FOREIGN PATENT DOCUMENTS

| | | |
|---|---|---|
| 0398244 | 11/1990 | European Pat. Off. . |
| 1922761 | 4/1976 | Germany . |
| 4015472 | 11/1990 | Germany . |
| 62-197989 | 1/1987 | Japan . |
| 1-134796 | 5/1989 | Japan . |
| 3-69092 | 3/1991 | Japan . |
| 3-58377 | 3/1991 | Japan . |

SEMICONDUCTOR MEMORY CELL

This application is a continuation of application Ser. No. 07/687,687, filed Apr. 19, 191, now abandoned.

BACKGROUND OF THE INVENTION

1. Field of the Invention

The present invention relates to a semiconductor memory cell, particularly, to a memory cell used in, for example, a dynamic random access memory (DRAM).

2. Description of the Related Art

FIG. 1 shows a memory cell widely used nowadays in a DRAM. As shown in the drawing, the memory cell comprises a MOS (insulated gate) type transistor Q acting as a transfer gate, which is connected to a word line WL and a bit line BL, and a capacitor C for information storage having a capacitor plate potential VPL connected to one end thereof.

The cells developed in an attempt to enhance the integration density of the DRAM cell of such a one transistor-one capacitor type include (a) a trench cell which utilizes a capacitor formed inside a trench formed on a substrate surface, and (b) a stacked cell constructed such that a capacitor comprising polysilicon films and an insulating film interposed between the polysilicon films is stacked on a transfer gate. Further, proposed is a cross point type cell constructed such that a single MOS transistor acting as a transfer gate and a single capacitor for information storage are arranged in a vertical direction, as disclosed in (1986 ISSCC Digest of Tech. Papers, pp. 268–269,"A 4 Mb DRAM with Cross-point Trech Transistor Cell " by A. SHAH et al.).

However, the conventional memory cells outlined above necessitate a highly complex manufacturing process and a long manufacturing time. It is considered very difficult to overcome these difficulties as a result of researches on the trench cell, etc. noted above.

SUMMARY OF THE INVENTION

An object of the present invention is to provide a semiconductor memory cell which permits overcoming the above-noted difficulties inherent in the conventional DRAM cell. The pattern area per bit of the cell of the present invention is markedly smaller than that of the conventional one transistor-one capacitor type DRAM cell, leading to a high integration density and a marked reduction in the unit cost per bit of the memory cell.

To achieve the object noted above, the present invention provides a semiconductor memory cell comprising a cascade gate including a plurality of cascade-connected MOS transistors and having one end connected to a read/write node, and a plurality of capacitors for information storage connected respectively to said MOS transistors.

In the semiconductor memory cell of the present invention, the MOS transistors forming the cascade gate are sequentially turned on or off in a predetermined order so as to sequentially read information stored in the capacitors onto the read/write node. Further, the information can be sequentially written into the capacitors.

The present invention also provides a semiconductor memory cell, comprising a cascade gate including at least three cascade-connected MOS transistors arranged between first and second nodes, and a plurality of capacitors for information storage each connected at one end to the connection node between adjacent MOS transistors. In the memory cell of this construction, the MOS transistors forming the cascade gate are sequentially turned on or off in a predetermined order so as to sequentially read information stored in the capacitors onto the first node. Further, the information in the second node can be sequentially written into the capacitors. In addition, it is possible to read sequentially the information from the capacitors onto the first node and to sequentially write to the information read onto the first node into the capacitors by sequentially turning the MOS transistors forming the cascade gate on or off in a predetermined order except the MOS transistor at one of the both ends of the cascade gate, said MOS transistor being kept turned off. Likewise, it is possible to sequentially read the information from the capacitors onto the second node and to sequentially write the information read onto the second node into the capacitors.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
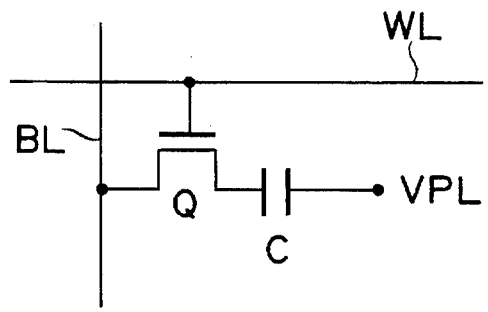
FIG. 1 is an equivalent circuit diagram showing the construction of a conventional DRAM cell of one transistor-one capacitor type.

The accompanying drawings show some embodiments of the present invention. Throughout the drawings, like reference numerals denote the like members of the semiconductor memory cell.

Figure 4:
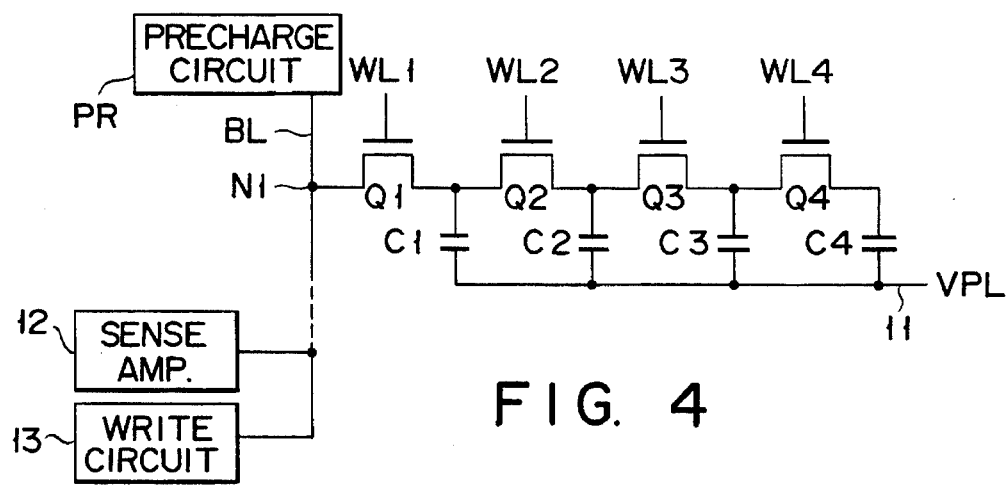
FIG. 4 is an equivalent circuit diagram showing a semiconductor memory cell according to one embodiment of the present invention.

Specifically, FIG. 4 shows a semiconductor memory cell according to a first embodiment of the present invention. As seen from the drawing, the memory cell comprises a first cascade gate consisting of a plurality of, e.g., four, cascade-connected first MOS transistors Q1 to Q4. One end of the first cascade gate, i.e., one end of the MOS transistor Q1 in the drawing, is connected to a read/write node N1. Further, capacitors C1 to C4 for information storage are connected to the first MOS transistors Q1 to Q4, respectively, at the ends remote from the node N1, so as to form a DRAM cell.

A memory cell array formed of a plurality of the DRAM cells described above is used in a DRAM. In this case, the gates of the first MOS transistors Q1 to Q4 are connected to word lines WL1 to WL4 of the memory cell array, respectively, with the node N1 connected to a bit line BL of the memory cell array. Further, the other ends of the capacitors C1 to C4 are commonly connected to a capacitor wiring 11 of the memory cell array. In this embodiment, the plate electrodes of the capacitors C1 to C4 are commonly connected to each other, and a predetermined capacitor plate potential VPL is given to the plate electrode commonly with another DRAM cell. As seen from the drawing, a bit line precharging circuit PR is connected to the bit line BL. A sense amplifier 12 senses and amplifies the potential of the bit line BL. Further, a write circuit 13 serves to set the potential of the bit line BL in accordance with the data to be written.

Figure 5:
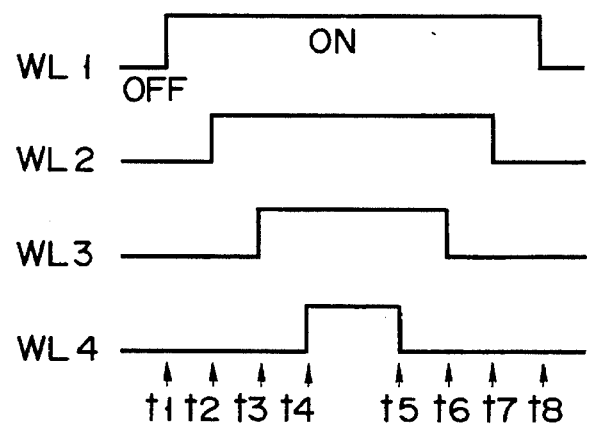
FIG. 5 shows wave forms denoting as an example the timing of the read operation and write operation of the memory cell shown in FIG. 4.

FIG. 5 shows timing wave forms exemplifying how the cascade gate type DRAM cell shown in FIG. 4 performs the read operation and write operation. In this embodiment, the word lines WL1 to WL4 are turned on or off at the timings shown in FIG. 5 so as to sequentially turn the first MOS transistors Q1 to Q4 on in this order and the transistors Q4 to Q1 off in this order. To be more specific, if the word line WL1 is turned on at the time t1 after precharging of the bit line BL to a predetermined potential by the bit line precharging circuit PR, the transistor Q1 is turned on, with the result that the information stored in the capacitor C1 is read through the transistor Q1 onto the bit line BL and, then, sensed by the sense amplifier 12. Then, if the word line WL2 is turned on at the time t2 after the bit line BL is precharged again for a predetermined period of time, the transistor Q2 is turned on, with the result that the information stored in the capacitor C2 is read through the transistors Q2 and Q1 onto the bit line BL. If the word line WL3 is turned on in the next stage at the time t3 after the bit line BL is precharged again for a predetermined period of time, the transistor Q3 is turned on, with the result that the information stored in the capacitor C3 is read through the transistors Q3, Q2 and Q1 onto the bit line BL. If the word line WL4 is turned on in the next stage at the time t4 after the bit line BL is precharged again for a predetermined period of time, the transistor Q4 is turned on, with the result that the information stored in the capacitor C4 is read through the transistors Q4 and Q3 onto the bit line BL. Further, if the word line WL4 is turned off at the time t5, the transistor Q4 is turned off so as to write the information of the bit line BL, i.e., the write data set by the write circuit 13, into the capacitor C4. The sense amplifier 12 can serve as the write circuit 13. If the word line WL3 is turned off in the next stage at the time t6, the transistor Q3 is turned off so as to write the information of the bit line BL into the capacitor C3. If the word line WL2 is turned off in the next stage at the time t7, the transistor Q2 is turned off so as to write the information of the bit line BL into the capacitor C2. Further, if the word line WL1 is turned off in the next stage at the time t8, the transistor Q1 is turned off so as to write the information of the bit line BL into the capacitor C1.

It is possible to rearrange the order of reading data, to correct an error, etc. during the series of the reading operation and the series of the writing operation described above, i.e., between the times t4 and t5 shown in FIG. 5.

In the cascade gate type DRAM cell as shown in FIG. 4, it is possible to sequentially read onto the node N1 the information stored in the capacitors in the order starting with the information stored in the capacitor C1 positioned close to the node N1 and ending with the information stored in the capacitor C4 remote from the node N1 by sequentially turning the transistors Q1 to Q4 in a predetermined order. It is also possible to sequentially write the information of the node N1 into the capacitors starting with the capacitor C4 remote from the node N1 and ending with the capacitor C1 close to the node N1.

In the embodiment shown in FIG. 4, the node N1 is connected to the bit line BL. However, it is possible to connect the node N1 directly to the input terminal of the sense amplifier 12.

Figure 6:
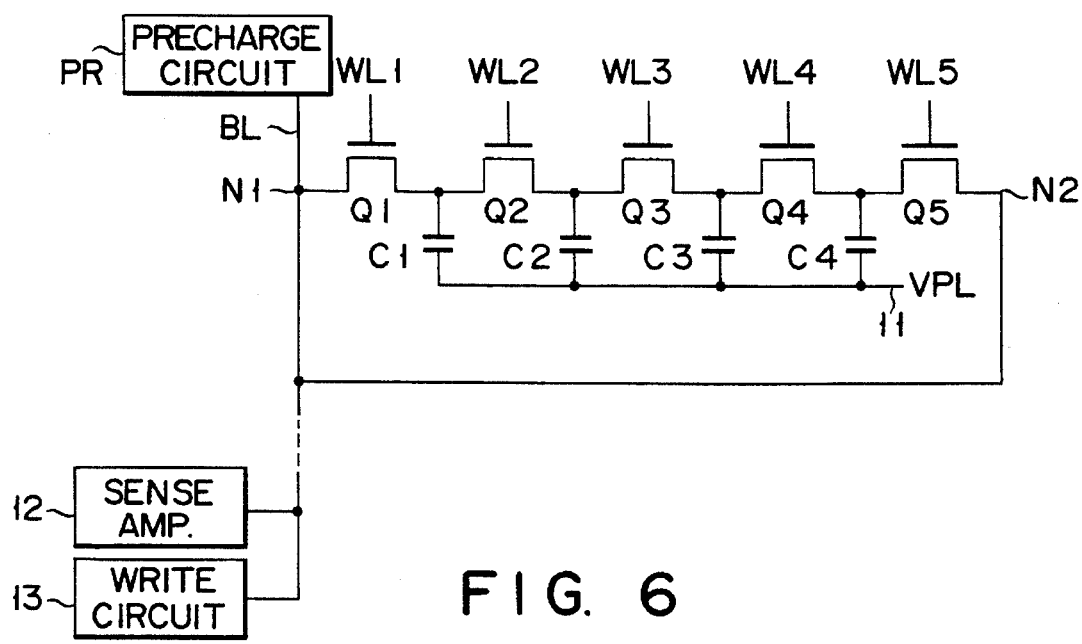
FIG. 6 is an equivalent circuit diagram showing a semiconductor memory cell according to another embodiment of the present invention.

FIG. 6 shows a semiconductor memory cell according to a second embodiment of the present invention. As seen from the drawing, the cascade gate type DRAM cell of the second embodiment comprises a cascade gate including a plurality of cascade-connected first MOS transistors Q1 to Q5 and connected between a first node N1 and a second node N2, and a plurality of capacitors C1 to C4 connected at one end to the connection nodes between adjacent MOS transistors, respectively. In this embodiment, it is necessary to use at least three MOS transistors forming the cascade gate, though five MOS transistors are shown in the drawing.

A memory cell array is formed of a plurality of the DRAM cells constructed as shown in FIG. 6, and is used in a DRAM. The gates of the MOS transistors Q1 to Q5 are connected to word lines WL1 to WL5 of the memory cell array, respectively. The first node N1 and the second node N2 are commonly connected to the bit line BL of the memory cell array. The other ends of the capacitors C1 to C4 are commonly connected to the capacitor wiring 11 of the memory cell array. In this embodiment, a capacitor plate potential VPL is imparted to the capacitor wiring 11. The arrangement shown in FIG. 6 further comprises a bit precharging circuit PR, a sense amplifier 12 and a write circuit 13.

Figure 7:
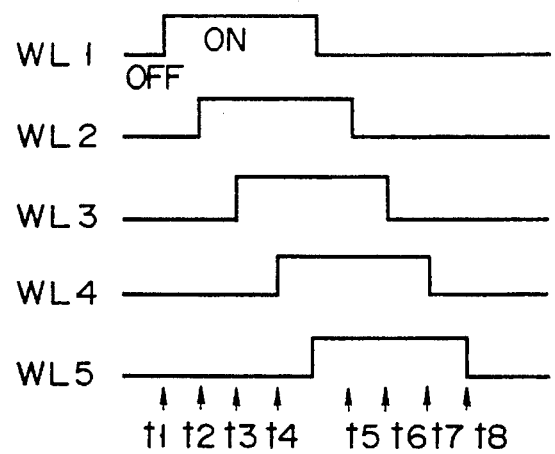
FIG. 7 shows wave forms denoting as an example the timing of the read operation and write operation of the memory cell shown in FIG. 6.

FIG. 7 shows timing wave forms exemplifying how the memory cell shown in FIG. 6 performs the read operation and write operation. In this embodiment, the word lines WL1 to WL5 are turned on or off at the timings shown in FIG. 7 so as to sequentially turn the first MOS transistors Q1 to Q5 on in this order and turn the transistors Q1 to Q5 off in this order. If the transistors Q1 to Q5 are sequentially turned on in this order, the information stored in the capacitors is sequentially read onto the node N1 starting with the information stored in the capacitor C1 close to the node N1 and ending with the information stored in the capacitor C4 remote from the node N1, as described previously with reference to FIG. 5. Then, the word line WL1 is turned off so as to turn the transistor Q1 off, and the word line WL5 is turned on so as to turn the transistor Q5 on. This operation may be reversed. If the word line WL2 is turned off in the next stage at the time t5, the transistor Q2 is turned off so as to write the information of the node N2 in the capacitor C1. If the word line WL3 is turned off in the next stage at the time t6, the transistor Q3 is turned off so as to write the information of the node N2 in the capacitor C2. Further, if the word line WL4 is turned off in the next stage at the time t7, the transistor Q4 is turned off so as to write the information of the node N2 in the capacitor C3. Finally, if the word line WL5 is turned off in the next stage at the time t8, the transistor Q5 is turned off so as to write the information of the node N2 in the capacitor C4.

It is possible to rearrange the order of reading data, to correct an error, etc. during the series of the reading operation and the series of the writing operation described above, i.e., between the times t4 and t5 shown in FIG. 7.

In the cascade gate type DRAM cell as shown in FIG. 6, it is possible to sequentially read onto the first node N1 the information stored in the capacitors in the order starting with the information stored in the capacitor C1 positioned close to the node N1 and ending with the information stored in the capacitor C4 remote from the node N1 by sequentially turning the transistors Q1 to Q5 in a predetermined order. It is also possible to sequentially write the information of the node N2 into the capacitors in the order starting with the capacitor C1 close to the node N1 and ending with the capacitor C4 remote from to the node N1.

In the embodiment shown in FIG. 6, the first node N1 and the second node N2 are commonly connected to the same bit line BL. However, it is also possible for these first and second nodes N1 and N2 to be separately connected to different bit lines or different sense amplifiers.

Suppose the word lines WL1 to WL5 are sequentially driven in the order opposite to that shown in FIG. 7, i.e., in the order of WL5 to WL1, so as to sequentially turn the transistors Q5 to Q1 on in this order and to sequentially turn the transistors Q5 to Q1 off in this order. In this case, the information stored in the capacitors is sequentially read onto the second node N2 starting the information stored in the capacitor C4 close to the second node N2 and ending with the information stored in the capacitor C1 remote from the second node N2. Also, the information of the first node N1 is sequentially written into the capacitors starting the capacitor C4 close to the second node N2 and ending with the capacitor C1 remote from the second node N2.

It should also be noted that the information can be selectively interchanged between the first node N1 and the second node N2 of the DRAM cell constructed as shown in FIG. 6, if one of the transistors Q1 and Q5 positioned at the ends of the cascade gate is kept turned off such that the remaining transistors Q2 to Q5 or Q1 to Q4 are turned on or off as described previously in conjunction with the DRAM cell shown in FIG. 4.

If an array of the cascade gate type DRAM cells of the present invention describe above is used for forming a DRAM, the random access characteristic or the access time of the DRAM are somewhat restricted by the serial access characteristic, i.e., sequential reading and sequential writing, of the DRAM cell. However, the known DRAM performs a 4-bit serial access operation such as a nibble mode. Of course, such a serial access characteristic is fully acceptable in the present invention. Also, in the case of forming a DRAM, the random access characteristic can be completely maintained as a DRAM of ×4 bit structure, if a serial-to-parallel conversion is applied to the 4-bit read/write data of the DRAM cell. In addition, it is possible to achieve a DRAM of ×8 bit structure or ×16 bit structure by the serial-to-parallel conversion, in the case where the memory cell array is divided into a plurality of sub-arrays and some sub-arrays alone, e.g., 2 to 4 sub-arrays, are simultaneously activated for the purpose of power saving. Further, the field of DRAM application, in which it suffices to employ the serial access such as the block transfer between the DRAM and a cache memory as well as the processing and holding of data for picture image, is rapidly widened in recent years. Under the circumstances, the restriction of the random access characteristic noted above does not obstruct at all the improvement in the integration density achieved by the present invention.

Figure 8A:
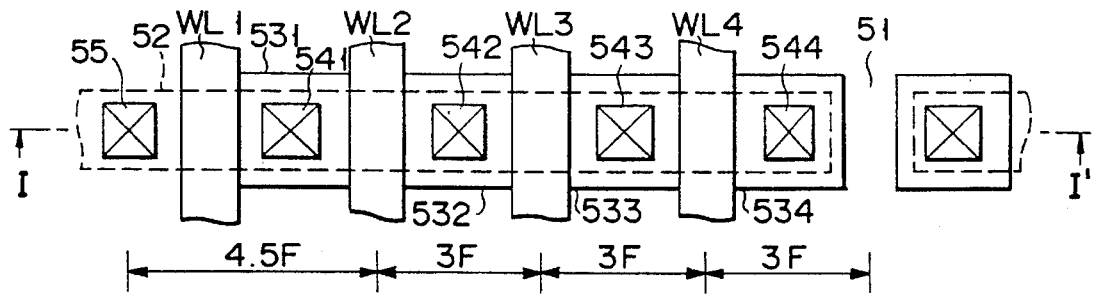
FIG. 8A is a plan view showing that a stacked cell structure is employed in the semiconductor memory cell shown in FIG. 4.
Figure 8B:
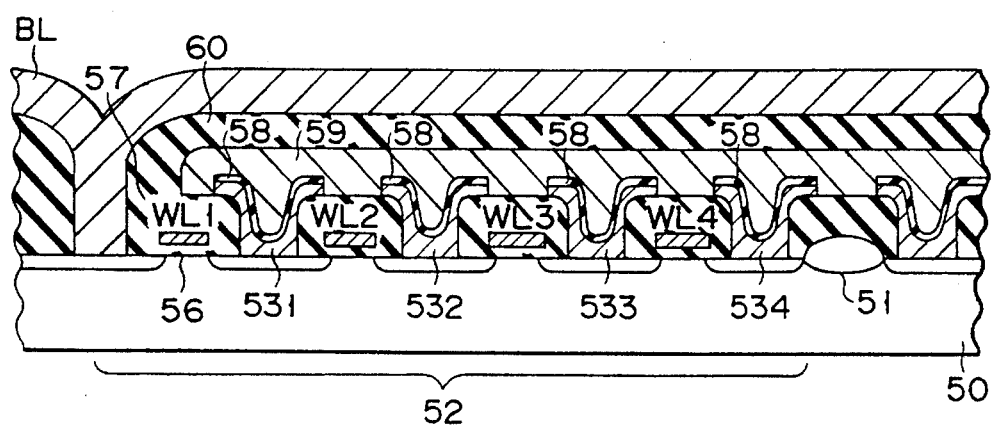
FIG. 8B is a cross sectional view along the line I–I' shown in FIG. 8A.

The cascade gate type DRAM cell of the present invention is constructed as shown in, for example, FIG. 8. Specifically, FIG. 8A is a plan view showing the semiconductor memory cell shown in FIG. 4, which is formed as a stacked cell structure. The memory cell is used in a DRAM array, e.g., a DRAM cell array of an open bit line system, in which a memory node is formed at each of the intersections between the word lines and the bit line. FIG. 8B is a cross sectional view along the line B—B shown in FIG. 8A.

As shown in the drawings, the DRAM cell comprises a semiconductor substrate 50, a field isolation region 51, a cell active region 52 in which the active regions, i.e., source, drain and channel regions, of four transistors Q1 to Q4 are linearly arranged on the surface of the semiconductor substrate 50, gates (word lines) WL1 to WL4 of the transistors Q1 to Q4, storage nodes 531 to 534 of four capacitors C1 to C4 for information storage, contacts 541 to 544 between the storage nodes 531 to 534 and the source regions of the transistors Q1 to Q4, respectively, a contact 55 (bit line contact) between the drain region of the transistor Q1 and the bit line BL, a gate insulation film 56, an interlayer insulation film 57, an insulation film 58 for each of the capacitors C1 to C4, a plate electrode 59 for the four capacitors C1 to C4, and an interlayer insulation film 60.

The bit line contact 55 is commonly used for another memory cell (not shown). In other words, a single bit line contact is commonly used for two memory cells (i.e., one contact per 8 bits or ½ contact per 4 bits).

Figure 2:
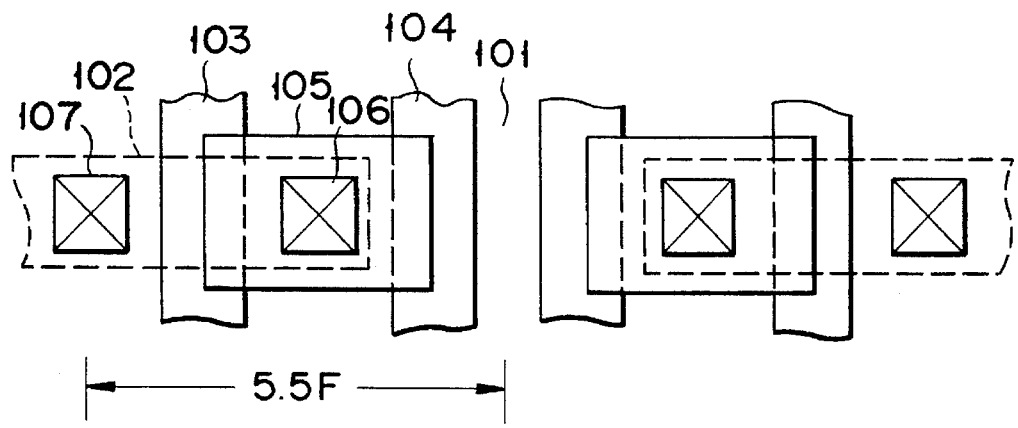
FIG. 2 is a plan view showing the construction of a stacked cell of one transistor-one capacitor type included in a DRAM cell array of a conventional folded bit line system.
Figure 3:
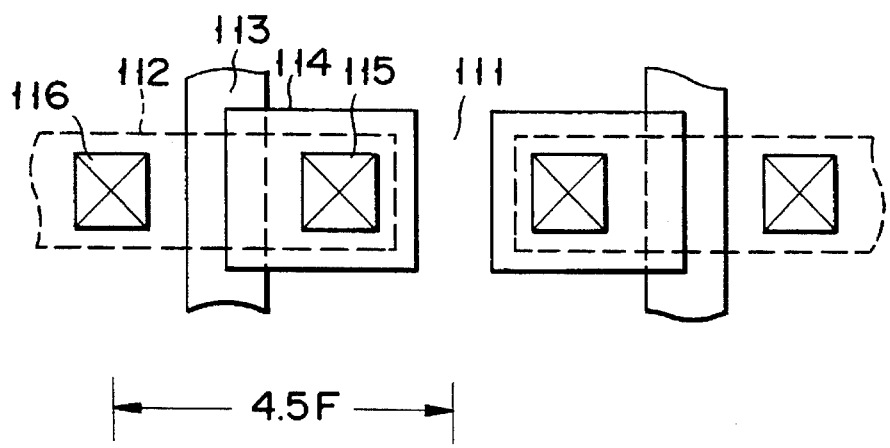
FIG. 3 is a plan view showing the construction of a stacked cell of one transistor-one capacitor type included in a DRAM cell array of a conventional open bit line system.

For comparison of the pattern area between the cascade gate type DRAM cell of the present invention shown in FIGS. 8A, 8B and the conventional one transistor-one capacitor type DRAM cell, FIG. 2 shows the plan view of the stacked cell in the conventional DRAM cell array of the folded bit line system. FIG. 3 is a plan view showing the stacked cell in the conventional DRAM cell array of the open bit line system. The stacked cell shown in FIG. 2 comprises a field isolation region 101, an active region 102 of a transistor for transfer gate, a gate (word line) 103 of the transistor, a word line 104 for another transistor (not shown), a storage node 105 of the capacitor for information storage, a contact 106 between the storage node 106 and the source region of the transistor, and a contact 107 between the drain region of the transistor and a bit line (not shown). The stacked cell further comprises a plate electrode (not shown) of the capacitor for information storage. On the other hand, the stacked cell shown in FIG. 3 comprises a field isolation region 111, an active region 112 of a transistor for transfer gate, a gate (word line) 113 of the transistor, a storage node 114 of a capacitor for information storage, a contact 115 between the storage node 114 and the source region of the transistor, and a contact 116 (bit line contact) between the drain region of the transistor and a bit line (not shown). The stacked cell further comprises a plate electrode (not shown) of the capacitor for information storage.

Where the allowance for aligning a mask pattern is set at 0.5 F ("F" denoting the minimum size in the manufacturing process of the cell) in the DRAM cell shown in each of FIGS. 2 and 3, the long sides of the conventional cells in FIGS. 2 and 3 are 5.5 F and 4.5 F, respectively. On the other hand, the long side of the pattern portion covering the transistor Q1 and the capacitor C1 is 4.5 F in the DRAM cell of the present invention shown in FIG. 8A, which is substantially equal to that of the conventional cell. However, the long side of the pattern portion covering a pair of the transistor Q2 and the capacitor C2, a pair of the transistor Q3 and the capacitor C3, or a pair of the transistor Q4 and the capacitor C4 is 3 F in the DRAM cell shown in FIG. 8A. In other words, the long side of the entire cell is 13.5 F in the DRAM cell shown in FIG. 8. It follows that, in the case of a memory system of one bit per capacitor, the long side per bit of the cell is 3.375 F in the present invention, which is 75% of the long side in the conventional cell shown in FIG. 3 and only 61% of the long side in the conventional cell shown in FIG. 2. Clearly, the present invention permits markedly diminishing the area per bit of the cell, leading to an improved integration density.

It should also be noted that the area of each of the capacitors C1 to C4 included in the DRAM cell of the present invention shown in FIG. 8A is smaller than that of the capacitor C included in the conventional cell shown in FIGS. 2 and 3. This may suggest that a capacitor capacitance Cs is diminished in the present invention, leading to an increase in a ratio Cb/Cs of a bit line capacitance Cb to the cell capacitor capacitance Cs. However, two DRAM cells are connected to the node N1 in the present invention, though only one DRAM cell is shown in the drawing. In other words, one bit line contact is used for 8 bits (½ bit contact line per 4 bits), with the result that the bit line capacitance Cb is also markedly diminished in the present invention. It follows that the value of Cb/Cs ratio is smaller in the present invention than in the prior art, leading to a larger change in the bit line potential in the data reading step. What should also be noted is that the marked reduction in the bit line capacitance Cb permits saving of power consumption.

Incidentally, it is possible to increase the capacitor capacitance Cs, though a process change is required to some extent in this case, as described in, for example, "1988 IEDM Technical Digest, pp. 592–595 '3-DIMENSIONAL STACKED CAPACITOR CELL FOR 16M AND 64M DRAMS' by T. EMA et al" or "Stacked Capacitor Cells for High-density Dynamic RAMs" by H. WATANABE et al on pp. 600–603 of the literature noted above. In this case, the array is constructed to include one bit at every intersection between the bit line and the word lines.

The DRAM cell of the present invention shown in FIGS. 8A and 8B is of a stacked cell structure. However, the present invention also permits providing a DRAM cell of a cross point cell structure by employing the technique described in, for example, "1989 IEDM Technical Digest, pp. 23–26, 'A Surrounding Gate Transistor (SGT) Cell for 64/256 Mbit DRAMs' by K. SUNOUCHI et al.

Figure 9A:
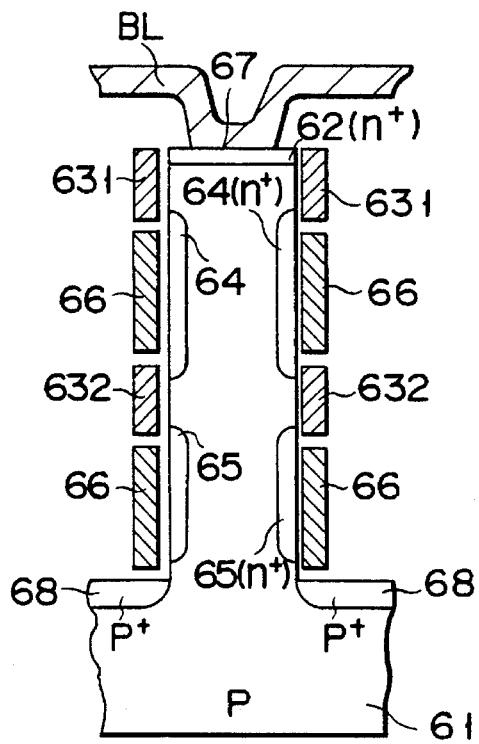
FIG. 9A is a cross sectional view showing an example of the semiconductor memory cell of the present invention employing a cross point cell structure.
Figure 9B:
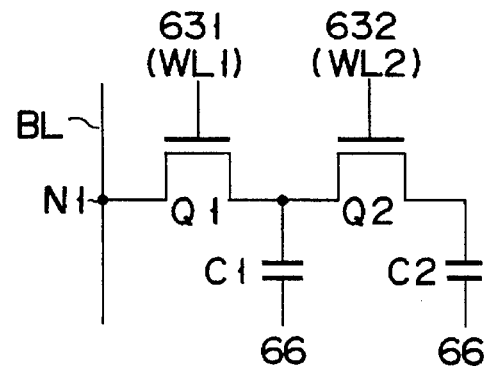
FIG. 9B is an equivalent circuit diagram showing the semiconductor memory cell shown in FIG. 9A.

FIG. 9A is a cross sectional view exemplifying a DRAM cell of the present invention utilizing a cross point cell structure. On the other hand, FIG. 9B is an equivalent circuit diagram of the cell shown in FIG. 9A. In this embodiment, a pair of a vertical transistor and a vertical capacitor is stacked upon another pair in the vertical direction. It should be noted that the bit portion covering the number of pairs of the stacked vertical transistors and vertical capacitors can be integrated into a cell size equal to the one bit portion in the prior art. As seen from the drawings, the DRAM cell comprises a p-type semiconductor substrate 61 having a convex portion partially formed on the surface, an $n^+$type drain region 62 of a transistor Q1 formed on the upper surface of the convex portion of the substrate 61, gate (word line) 631 (WL1) of the transistor Q1, gate (word line) 632 (WL2) of the transistor Q2 formed in the side surfaces of the convex portion of the substrate with gate insulation films interposed between these gates and the substrate, $n^+$-type conductive layers 64, i.e., the source region of the transistor Q1, storage node of a capacitor C1, drain region of a transistor Q2, partially formed on the side surface of the convex portion of the substrate 61, an $n^+$type source region 65 of the transistor Q2 formed in the lower end portions of the side surfaces of the convex portion of the substrate, a plate electrode 66 of a capacitor C1 or C2 partially formed on the side surface of the convex portion of the substrate with a gate insulation film interposed between the plate 66 and the substrate, a bit line BL, a contact 67 (bit line contact) between the bit line BL and the drain region 62 of the transistor Q1, and a $p^+$-type element isolation region 68.

In each of the DRAM cells shown in FIG. 4 and 6, the other ends of the capacitors C1 to C4 are commonly connected to the capacitor plate potential VPL. However, it is also possible to connect each of the other ends of the capacitors C1 to C4 to a power source potential $V_{CC}$ given from the outside or to the ground potential $V_{SS}$.

Figure 10:
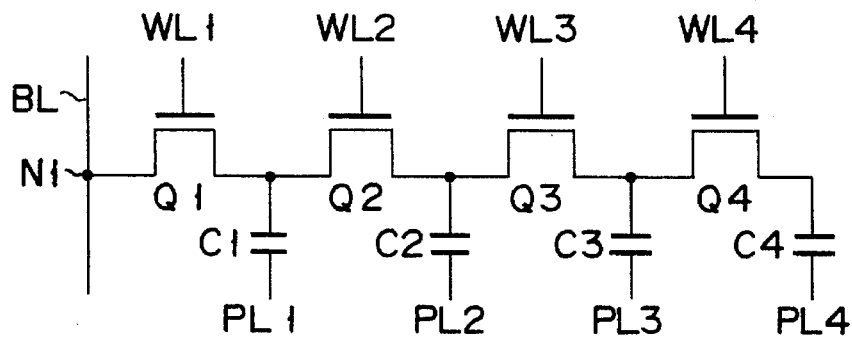
FIG. 10 is an equivalent circuit diagram showing a modification of the memory cell shown in FIG. 4.

It is also possible to achieve the DRAM cell of the present invention by utilizing the technique of allowing the capacitor plate to perform the clock operation, as described in "IEEE JOURNAL OF SOLID-STATE CIRCUITS, VOL. SC-17, NO. 5, p-872, Oct. 1982, 'A Storage-Node-Boosted RAM with Word-Line Delay Compensation' by K. FUJISHIMA et al". FIG. 10 is an equivalent circuit diagram of the DRAM cell prepared by applying the technique described in this literature to, for example, the DRAM cell shown in FIG. 4. In this case, capacitor wirings PL1 to PL4 are connected to the other ends of the capacitors C1 to C4, respectively, as shown in FIG. 10.

Figure 11:
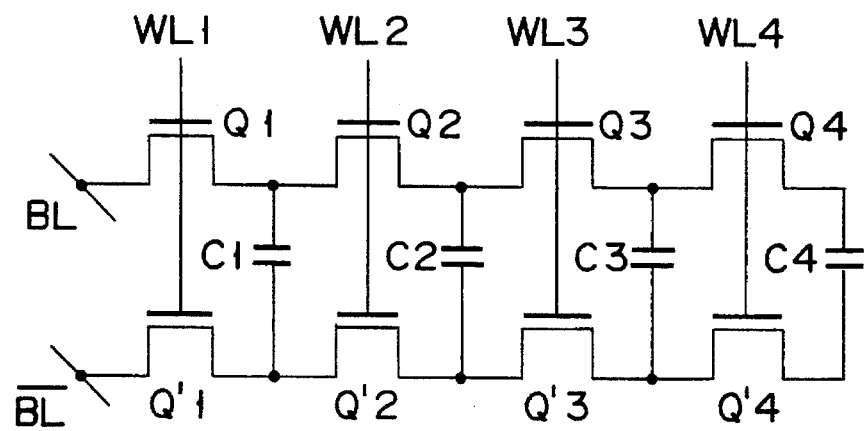
FIG. 11 is an equivalent circuit diagram showing another modification of the memory cell shown in FIG. 4.

It is also possible to achieve the DRAM cell of the present invention by utilizing the technique of connecting transfer gates to both ends of each of the capacitors, as described in "1989 Symposium of VLSI Circuits, Digest of Tech. Papers, pp. 101–102, 'A Novel Memory Cell Architecture for High-Density DRAMs', FIG. 1(b), by Y. OHTA et al." FIG. 11 is an equivalent circuit diagram of the DRAM cell prepared by applying the technique described in this literature to the DRAM cell shown in FIG. 4. On the other hand, FIG. 12 is an equivalent circuit diagram of the DRAM cell prepared by applying the technique described in this literature to the DRAM cell shown in FIG. 6.

The DRAM cell shown in FIG. 11 comprises cascade-connected second MOS transistors Q1' to Q4' acting as transfer gates. The sources of these transistors Q1' to Q4' are connected to the other ends of the capacitors C1 to C4, respectively, and the gates of these second transistors Q1' to Q4' are connected to the gates of the first transistors Q1 to Q4, respectively. Further, the drains of the first and second transistors Q1 and Q1' are connected to complementary bit lines BL and $\overline{BL}$, respectively. Incidentally, it is possible to connect the drains of these transistors Q1 and Q1' directly to a pair of differential input terminals of the sense amplifier.

Figure 12:
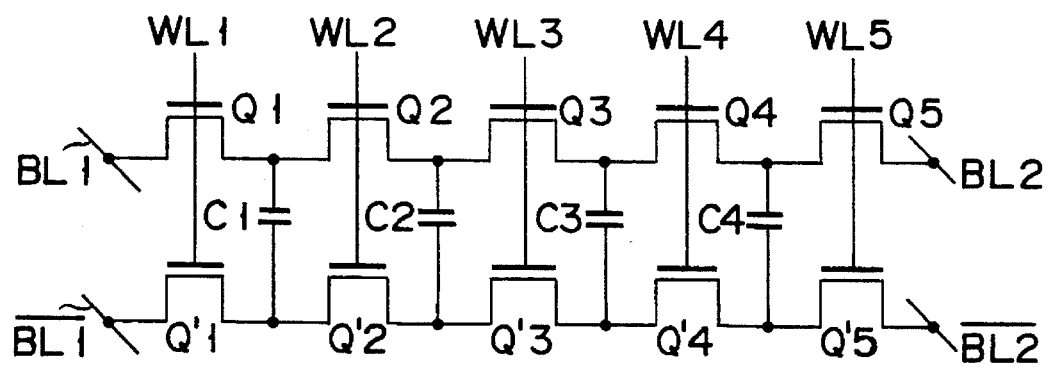
FIG. 12 is an equivalent circuit diagram showing a modification of the memory cell shown in FIG. 6.

The DRAM cell shown in FIG. 12 comprises cascade-connected second MOS transistors Q1' to Q5' acting as transfer gates. In this embodiment, the connection nodes between adjacent second transistors are connected to the other ends of the capacitors C1 to C4, respectively. Also, the gates of the second transistors Q1' to Q5' are connected to the gates of the first transistors Q1 to Q5, respectively. The first and second transistors Q1 and Q1' are connected at one end to complementary bit lines BL1 and $\overline{BL1}$, respectively. Likewise, the first and second transistors Q5 and Q5' are connected at the other end to complementary bit lines BL2, $\overline{BL2}$, respectively. Incidentally, it is possible to connect the other ends of the transistors Q5, Q5' to the complementary bit lines BL1, $\overline{BL2}$, respectively, such that the transistors Q1, Q5 are commonly connected to the bit line BL1 and the transistor Q1' and Q5' commonly to the bit line $\overline{BL1}$.

In each of the embodiments described above, the DRAM cell is constructed such that one bit signal of "1" or "0" (one digital data) is stored in a single capacitor. However, it is possible to construct the DRAM cell such that data consisting of a plurality of bits is stored in a single capacitor.

As described above in detail, the semiconductor memory cell of the present invention permits markedly diminishing the cell area per bit using the conventional process technology, leading to a marked reduction in the unit cost per bit. It follows that the present invention makes it possible to avoid the problem inherent in the prior art, i.e., the problem that the manufacturing process is made highly complex and the manufacturing time is increased with increase in the integration density. Further, if a new process technique is developed, the integration density can be further enhanced drastically by the present invention. Naturally, the present invention is highly advantageous in the case of manufacturing a DRAM of a large capacity at a low cost for use as a substitute for memory media such as a magnetic disk.

The present invention is not restricted by the embodiments described with reference to the accompanying drawings. In other words, various modifications are available within the technical scope of the present invention.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory, comprising:
   a first data node;
   a first MOS transistor having first and second terminals, said first terminal of said first MOS transistor connected to said first data node;
   a second MOS transistor having first and second terminals, said first terminal of said second MOS transistor connected to said second terminal of said first MOS transistor;
   first and second data storage capacitors, each of said data storage capacitors having a first electrode connected to the second terminal of a respective corresponding one of said first and second MOS transistors, and a second electrode; and
   first and second word lines electrically insulated from said second electrodes of said first and second data storage capacitors, each of said word lines connected to a gate of a respective corresponding one of said first and second MOS transistors, said first and second word lines applied with respective first and second word line signals which may simultaneously have different signal levels for controlling the ON/OFF switching of said first and second MOS transistors.

2. The semiconductor memory according to claim 1, further comprising:
   means for applying said first and second word line signals to said first and second word lines to switch said first and second MOS transistors such that data stored in said data storage capacitors is sequentially output to said first data node.

3. A semiconductor memory, comprising:
   a first data node;
   a second data node;
   a first MOS transistor having first and second terminals, said first terminal of said first MOS transistor connected to said first data node;
   a second MOS transistor having first and second terminals, said second terminal of said second MOS transistor connected to said second data node;
   a third MOS transistor having first and second terminals respectively coupled between said second terminal of said first MOS transistor and said first terminal of said second MOS transistor;
   first and second data storage capacitors, each of said data storage capacitors having a first electrode connected to the second terminal of a respective corresponding one of said first and third MOS transistors, and a second electrode; and
   first, second, and third word lines electrically insulated from said second electrodes of said first and second data storage capacitors, each of said word lines connected to a gate of a respective corresponding one of said first, second, and third MOS transistors, said first, second, and third word lines applied with respective first, second, and third word line signals, at least two of which may simultaneously have different signal levels, for controlling the ON/OFF switching of said first, second, and third MOS transistors.

4. The semiconductor memory according to claim 3, wherein said first data node and said second data node are connected to a same data line.

5. The semiconductor memory according to claim 3, further comprising:
   means for applying said first, second, and third word line signals to said first, second, and third word lines to switch said first, second, and third MOS transistors such that data stored in said data storage capacitors is sequentially output to said first data node.

6. The semiconductor memory according to claim 5, further comprising:
   a precharge circuit for precharging said first data node to a predetermined potential prior to outputting data from said first and second data storage capacitors.

7. The semiconductor memory according to claim 5, further comprising:
   a sense amplifier for sensing data output to said first data node.

8. The semiconductor memory according to claim 3, further comprising:
   a write circuit for supplying data to said second data node for writing to said first and second data storage capacitors.

9. The semiconductor memory according to claim 8, further comprising:

means for applying said first, second, and third word line signals to said first, second, and third word lines to switch said first, second, and third MOS transistors such that data at said second data node is sequentially written to said data storage capacitors.

10. The semiconductor memory according to claim 3, further comprising:

means for applying said first, second, and third word line signals to said first, second, and third word lines to switch said first, second, and third MOS transistors such that data is sequentially read from and sequentially written to said data storage capacitors, wherein said first word line signal has a first signal level for switching said first MOS transistor ON, subsequently said third word line signal has a first signal level for switching said third MOS transistor ON, subsequently said second word line signal has a first signal level for switching said second MOS transistor ON, subsequently said first word line signal has a second signal level for switching said first MOS transistor OFF, subsequently said third word line signal has a second signal level for switching said third MOS transistor OFF, and subsequently said second word line signal has a second signal level for switching said second MOS transistor OFF.

11. The semiconductor memory according to claim 3, wherein the second electrode of each of said data storage capacitors is connected to a predetermined potential.

12. The semiconductor memory according to claim 3, wherein:

each of said first, second, and third MOS transistors has a drain region corresponding to said first terminal thereof, a source region corresponding to said second terminal thereof, and a channel region located between said drain and source regions, said drain, channel, and source regions of each of said first, second, and third MOS transistors arranged linearly in the stated order on a surface of a semiconductor substrate; and each of said first and second data storage capacitors has a storage electrode, an insulating film, and a plate electrode, said first data storage capacitor having a stack structure wherein said storage electrode of said first data storage capacitor contacts said source region of said first MOS transistor and said second data storage capacitor having a stack structure wherein said storage electrode of said second data storage capacitor contacts said source region of said third MOS transistor.

13. The semiconductor memory according to claim 3, wherein:

each of said first, second, and third MOS transistors has a drain region corresponding to said first terminal thereof, a source region corresponding to said second terminal thereof, and a channel region located between said drain and source regions, said drain region of said first MOS transistor formed on an upper surface of a projection formed on a surface of a semiconductor substrate, said channel and source regions of said first MOS transistor formed on a side surface of said projection and said drain, channel and source regions of said third MOS transistor formed on said side surface of said projection and located below said source of said first MOS transistor; and each of said first and second data storage capacitors has a storage electrode, an insulating film, and a plate electrode, said storage electrode of said first data storage capacitor located on said side surface of said projection and extending continuously between said source region of said first MOS transistor and said drain region of said third MOS transistor and said storage electrode of said second data storage capacitor located on said side surface of said projection and extending continuously in said source region of said third MOS transistor.

14. The semiconductor memory according to claim 3, further comprising:

a third data node;

a fourth data node;

a fourth MOS transistor having first and second terminals, said first terminal of said fourth MOS transistor connected to said third data node;

a fifth MOS transistor having first and second terminals, said second terminal of said fifth MOS transistor connected to said fourth data node;

a sixth MOS transistor having first and second terminals respectively coupled between said second terminal of said fourth MOS transistor and said first terminal of said fifth transistor, wherein the first electrode of said first data storage capacitor is connected to said second terminal of said first MOS transistor and the second electrode of said first data storage capacitor is connected to said second terminal of said fourth MOS transistor, and the first electrode of said second data storage capacitor is connected to said second terminal of said third MOS transistor and the second electrode of said second data storage capacitor is connected to said second terminal of said sixth MOS transistor.

15. The semiconductor memory according to claim 14, wherein said first word line is connected to a gate of said fourth MOS transistor, said second word line is connected to a gate of said sixth MOS transistor, and said third word line is connected to a gate of said fifth MOS transistor and said first, second and third word line signals control the ON/OFF switching of said first, second, third, fourth, fifth, and sixth MOS transistors.

16. The semiconductor memory according to claim 15, further comprising:

means for applying said first, second, and third word line signals to said first, second, and third word lines to switch said first, second, third, fourth, fifth, and sixth MOS transistors such that data stored in said data storage capacitors is sequentially output to said first data node.

17. The semiconductor memory according to claim 16, further comprising:

a precharge circuit for precharging said first data node to a predetermined potential prior to outputting data from said first and second data storage capacitors.

18. The semiconductor memory according to claim 17, further comprising:

a sense amplifier for sensing data output to said first data node.

19. The semiconductor memory according to claim 15, further comprising:

a write circuit for supplying data to said second data node for writing to said first and second data storage capacitors.

20. The semiconductor memory according to claim 19, further comprising:

means for applying said first, second, and third word line signals to said first, second, and third word lines to switch said first, second, third, fourth, fifth, and sixth MOS transistors such that data at said second data node is sequentially written to said data storage capacitors.

21. The semiconductor memory according to claim 15, further comprising:

means for applying said first, second, and third word line signals to said first, second, and third word lines to switch said first, second, third, fourth, fifth, and sixth MOS transistors such that data is sequentially read from and sequentially written to said data storage capacitors, wherein said first word line signal has a first signal level for switching said first and fourth MOS transistors ON, subsequently said third word line signal has a first signal level for switching said third and sixth MOS transistors ON, subsequently said second word line signal has a first signal level for switching said second and fifth MOS transistors ON, subsequently said first word line signal has a second signal level for switching said first and fourth MOS transistors OFF, subsequently said third word line signal has a second signal level for switching said third and sixth MOS transistors OFF, and subsequently said second word line signal has a second signal level for switching said second and fifth MOS transistors OFF.

22. The semiconductor memory according to claim 18, further comprising:

a write circuit for supplying data to said second data node for writing to said first and second data storage capacitors.

23. The semiconductor memory according to claim 22, further comprising:

means for applying said first, second, and third word line signals to said first, second, and third word lines to switch said first, second, third, fourth, fifth, and sixth MOS transistors such that data at said second data node is sequentially written to said data storage capacitors.

24. The semiconductor memory according to claim 22, further comprising:

means for applying said first second, and third word line signals to said first, second, and third word lines to switch said first, second, third, fourth, fifth, and sixth MOS transistors such that data is sequentially read from and sequentially written to said data storage capacitors, wherein said first word line signal has a first signal level for switching said first and fourth MOS transistors ON, subsequently said third word line signal has a first signal level for switching said third and sixth MOS transistors ON, subsequently said second word line signal has a first signal level for switching said second and fifth MOS transistors ON, subsequently said first word line signal has a second signal level for switching said first and fourth MOS transistors OFF, subsequently said third word line signal has a second signal level for switching said third and sixth MOS transistors OFF, and subsequently said second word line signal has a second signal level for switching said second and fifth MOS transistors OFF.

25. A dynamic semiconductor memory, comprising:

a first bit line;

at least two MOS transistors connected in series such that a first terminal of a first MOS transistor in said transistor series is coupled to said first bit line and a first terminal of each remaining MOS transistor in said transistor series is coupled to a second terminal of the immediately preceding MOS transistor in said transistor series;

data storage capacitors each having a first electrode coupled to the second terminal of a respective corresponding one of said MOS transistors in said transistor series, and a second electrode; and word lines electrically insulated from said second electrodes of said data storage capacitors, each of said word lines connected to a gate of a respective corresponding one of said MOS transistors in said transistor series, said word lines applied with respective word line signals, at least two of which may simultaneously have different signal levels, for controlling the ON/OFF switching of said MOS transistors in said transistor series.

26. The dynamic semiconductor memory according to claim 25, further comprising:

a second complementary bit line;

at least two other MOS transistors connected in series such that a first terminal of a first other MOS transistor in said other transistor series is coupled to said second bit line and a first terminal of each remaining other MOS transistor in said other transistor series is coupled to a second terminal of the immediately preceding transistor in said other transistor series, wherein said data storage capacitors are respectively connected between said second terminals of said at least two MOS transistors and said at least two other MOS transistors.

27. The dynamic semiconductor memory according to claim 25, comprising four MOS transistors and four data storage capacitors.

28. The dynamic semiconductor memory according to claim 25, comprising five MOS transistors and four data storage capacitors.

29. A dynamic semiconductor memory, comprising:

a first data node;

a second data node;

at least three MOS transistors connected in series such that a first terminal of a first MOS transistor in said transistor series is connected to said first data node, a second terminal of a last MOS transistor in said transistor series is connected to said second data node, and a first terminal of each remaining MOS transistor in said transistor series is connected to a second terminal of the immediately preceding transistor in said transistor series;

data storage capacitors each having a first electrode connected to the second terminal of a respective corresponding one of said MOS transistors in said transistor series except said last transistor, and a second electrode; and word lines electrically insulated from said second electrodes of said data storage capacitors, each of said word lines connected to a gate of a respective corresponding one of said MOS transistors in said transistor series, said word lines applied with respective word line signals, at least two of which may simultaneously have different signal levels, for controlling the ON/OFF switching of said MOS transistors in said transistor series.

30. The dynamic semiconductor memory according to claim 29, further comprising:

a third data node;

a fourth data node;

at least three other MOS transistors connected in series such that a first terminal of a first other MOS transistor in said other transistor series is connected to said third data node, a second terminal of a last other MOS transistor in said other transistor series is connected to said fourth data node, and a first terminal of each remaining other MOS transistor in said other transistor series is connected to a second terminal of the immediately preceding other MOS transistor in said other transistor series, wherein said data storage capacitors are respectively connected between said second terminals of said first and said remaining MOS transistors and said first other and said remaining other MOS transistors.

31. A method of sequentially reading data from and writing data to a semiconductor memory having a first data node, a first MOS transistor having first and second terminals, said first terminal of said first MOS transistor connected to said first data node, a second MOS transistor having first and second terminals, said first terminal of said second MOS transistor connected to said second terminal of said first MOS transistor, first and second data storage capacitors, each of said data storage capacitors connected to the second terminal of a respective corresponding one of said first and second MOS transistors, and first and second word lines, each of said word lines connected to a gate of a respective corresponding one of said first and second MOS transistors, said first and second word lines applied with respective first and second word line signals for controlling the ON/OFF switching of said first and second MOS transistors, the method comprising applying said first and second word line signals to said first and second word lines to switch said first and second MOS transistors such that data is sequentially read from and sequentially written to said data storage capacitors, wherein said first word line signal has a first signal level for switching said first MOS transistor ON, subsequently said second word line signal has a first signal level for switching said second MOS transistor ON, subsequently said second word line signal has a second signal level for switching said second MOS transistor OFF, and subsequently said first word line signal has a second signal level for switching said first MOS transistor OFF.

32. A method of sequentially reading data from and writing data to a semiconductor memory having a first data node, a second data node, a first MOS transistor having first and second terminals, said first terminal of said first MOS transistor connected to said first data node, a second MOS transistor having first and second terminals, said second terminal of said second MOS transistor connected to said second data node, a third MOS transistor having first and second terminals coupled between said second terminal of said first MOS transistor and said first terminal of said second MOS transistor, first and second data storage capacitors, each of said data storage capacitors connected to the second terminal of a respective corresponding one of said first and third MOS transistors, and first, second, and third word lines, each of said first, second, and third word lines connected to a gate of a respective corresponding one of said first, second, and third MOS transistors, said first, second, and third word lines applied with respective first, second, and third word line signals for controlling the ON/OFF switching of said first, second, and third MOS transistors, the method comprising applying said first, second, and third word line signals to said first, second, and third word lines to switch said first, second and third MOS transistors such that data is sequentially read from and sequentially written to said data storage capacitors, wherein said first word line signal has a first signal level for switching said first MOS transistor ON, subsequently said third word line signal has a first signal level for switching said third MOS transistor ON, subsequently said second word line signal has a first signal level for switching said second MOS transistor ON, subsequently said first word signal has a second signal level for switching said first MOS transistor OFF, subsequently said third word line signal has a second signal level for switching said third MOS transistor OFF, and subsequently said second word line signal has a second signal level for switching said second MOS transistor OFF.

33. A method of sequentially reading data from and writing data to a semiconductor memory having a data node, a first MOS transistor having first and second terminals, said first terminal of said first MOS transistor connected to said data node, a second MOS transistor having first and second terminals, said first terminal of said second MOS transistor connected to said second terminal of said first MOS transistor, first and second data storage capacitors, each of said data storage capacitors connected to the second terminal of a corresponding one of said first and second MOS transistors, and first and second word lines, each of said word lines connected to a gate of a corresponding one of said first and second MOS transistors for supplying respective signals to control the ON/OFF switching of said first and second MOS transistors, the method comprising the steps of:

applying a signal to the word line connected to the gate of said first MOS transistor to switch said first MOS transistor ON, to thereby read data from said first data storage capacitor to said data node;

applying a signal to the word line connected to the gate of said second MOS transistor, while said first MOS transistor is ON, to switch said second MOS transistor ON, to thereby read data from said second data storage capacitor to said data node;

applying a signal to the word line connected to the gate of said second MOS transistor, while said first MOS transistor is ON, to switch said second MOS transistor OFF, to thereby write data from said data node to said second data storage capacitor; and applying a signal to the word line connected to the gate of said first MOS transistor to switch said first MOS transistor OFF, to thereby write data from said data node to said first data storage capacitor.

34. A method of sequentially reading data from and writing data to a semiconductor memory having a first data node, a second data node, a first MOS transistor having first and second terminals, said first terminal and said first MOS transistor connected to said first data node, a second MOS transistor having first and second terminals, said second terminal of said second MOS transistor connected to said second data node, a third MOS transistor having first and second terminals coupled between said second terminal of said first MOS transistor and said first terminal of said second MOS transistor, first and second data storage capacitors, each of said data storage capacitors connected to the second terminal of a corresponding one of said first and third MOS transistors, and first, second, and third word lines, each of said word lines connected to a gate of a corresponding one of said first, second, and third MOS transistors for supplying respective signals to control the ON/OFF switching of said first, second, and third MOS transistors, the method comprising the steps of:

applying a signal to the word line connected to the gate of said first MOS transistor to switch said first MOS transistor ON, to thereby read data from said first data storage capacitor to said first data node;

applying a signal to the word line connected to the gate of said third MOS transistor, while said first MOS transistor is ON, to switch said third MOS transistor ON, to thereby read data from said second data storage capacitor to said first data node;

applying signals to the word lines connected to the gates of said first and second MOS transistors, while said third MOS transistor is ON, to switch said first transistor OFF and switch said second transistor ON;

applying a signal to the word line connected to said third MOS transistor, while said second transistor is ON, to switch said third MOS transistor OFF, to thereby write data at said second data node to said first data storage capacitor; and applying a signal to the word line connected to said second MOS transistor to switch said second MOS transistor OFF, to thereby write data at said second data node to said second data storage capacitor.

35. The method according to claim 34, wherein the step of supplying signals to the word lines connected to the gates of said first and second MOS transistors, while said third MOS transistor is ON, comprises the steps of supplying a signal to switch said first transistor OFF and subsequently supplying a signal to switch said second transistor ON.

36. The method according to claim 34, wherein the step of supplying signals to the word lines connected to the gates of said first and second MOS transistors, while said third MOS transistor is ON, comprises the steps of supplying a signal to switch said second transistor ON and subsequently supplying a signal to switch said first transistor OFF.

37. A semiconductor memory, comprising:

a first data node;

a first MOS transistor having first and second terminals, said first terminal of said first MOS transistor connected to said first data node;

a second MOS transistor having first and second terminals, said first terminal of said second MOS transistor connected to said second terminal of said first MOS transistor;

first and second data storage capacitors, each of said data storage capacitors having a first electrode connected to the second terminal of a respective corresponding one of said first and second MOS transistors, and a second electrode; and first and second word lines electrically insulated from said second electrodes of said first and second data storage capacitors, each of said word lines connected to a gate of a respective corresponding one of said first and second MOS transistors, said first and second word lines applied with respective first and second word line signals which may simultaneously have different signal levels for controlling the ON/OFF switching of said first and second MOS transistors, wherein the signal levels of said first and second word line signals vary during reading or writing operations for reading or writing data of arbitrary content so as to switch said first and second MOS transistors ON and OFF such that said data is respectively and sequentially read from or written to each of said first and second data storage capacitors.

38. A dynamic semiconductor memory, comprising:

a first bit line;

at least two MOS transistors connected in series such that a first terminal of a first MOS transistor in said transistor series is coupled to said first bit line and a first terminal of each remaining MOS transistor in said transistor series is coupled to a second terminal of the immediately preceding MOS transistor in said transistor series;

data storage capacitors each having a first electrode coupled to the second terminal of a respective corresponding one of said MOS transistors in said transistor series, and a second terminal; and word lines electrically insulated from said second electrodes of said data storage capacitors, each of said word lines connected to a gate of a respective corresponding one of said MOS transistors in said transistor series, said word lines applied with respective word line signals, at least two of which may simultaneously have different signal levels, for controlling the ON/OFF switching of said MOS transistors in said transistor series, wherein the signal levels of said word line signals vary during reading or writing operations for reading or writing data of arbitrary content so as to switch said MOS transistors in said transistor series ON and OFF such that said data is respectively and sequentially read from or written to each of said data storage capacitors.

39. The method according to claim 31, wherein the signal levels of said first and second word line signals are applied in the same manner during respective reading operations for reading data from said data storage capacitors, regardless of the content of the data which is read, and the signal levels of said first and second word line signals are applied in the same manner during respective writing operations for writing data to said data storage capacitors, regardless of the content of the data which is written.

40. The method according to claim 31, comprising the further step of precharging said first data node to a predetermined potential prior to outputting data from said first and second data storage capacitors.

41. The method according to claim 32, comprising the further step of precharging said first data node to a predetermined potential prior to outputting data from said first and second data storage capacitors.

42. The method according to claim 33, wherein the signal levels of said first and second word line signals are applied in the same manner during respective reading operations for reading data from said data storage capacitors, regardless of the content of the data which is read, and the signal levels of said first and second word line signals are applied in the same manner during respective writing operations for writing data to said data storage capacitors, regardless of the content of the data which is written.

43. The method according to claim 33, comprising the further step of precharging said first data node to a predetermined potential prior to outputting data from said first and second data storage capacitors.

44. The method according to claim 34, comprising the further step of precharging said first data node to a predetermined potential prior to outputting data from said first and second data storage capacitors.

45. The semiconductor memory according to claim 37, wherein the signal levels of said first and second word line signals vary in the same manner during respective reading operations for reading data from said data storage capacitors, regardless of the content of the data which is read, and the signal levels of said first and second word line signals vary in the same manner during respective writing operations for writing data to said data storage capacitors, regardless of the content of the data which is written.

46. The semiconductor memory according to claim 38, wherein the signal levels of said first and second word line signals vary in the same manner during respective reading operations for reading data from said data storage capacitors, regardless of the content of the data which is read, and the signal levels of said first and second word line signals vary in the same manner during respective writing operations for writing data to said data storage capacitors, regardless of the content of the data which is written.

47. A dynamic semiconductor memory, comprising:

a first data node;

a first MOS transistor having first and second terminals, said first terminal of said first MOS transistor connected to said first data node;

a second MOS transistor having first and second terminals, said first terminal of said second MOS transistor connected to said second terminal of said first MOS transistor;

first and second data storage elements, each of said data storage elements having a first terminal connected to the second terminal of a respective corresponding one of said first and second MOS transistors;

first and second word lines each connected to a gate of a respective corresponding one of said first and second MOS transistors, wherein said word lines are applied with respective first and second word line signals, which may simultaneously have different signal levels, for controlling the ON/OFF switching of said MOS transistors in said transistor series such that the signal levels of said first and second word line signals during reading operations for reading data from said data storage elements and writing operations for writing data to said data storage elements do not depend on the content of the data.

48. The semiconductor memory according to claims 2 or 45, further comprising:

a precharge circuit for precharging said first data node to a predetermined potential prior to outputting data from said first and second data storage capacitors.

49. The semiconductor memory according to claims 2 or 45, further comprising:

a sense amplifier for sensing data output to said first data node.

50. The semiconductor memory according to claims 1 or 45, further comprising:

a write circuit for supplying data to said first data node for writing to said first and second data storage capacitors.

51. The semiconductor memory according to claim 50, further comprising:

means for applying said first and second word line signals to said first and second word lines to switch said first and second MOS transistors such that data supplied to said first data node by said write circuit is sequentially written to said data storage capacitors.

52. The semiconductor memory according to claim 1, further comprising:

means for applying said first and second word line signals to said first and second word lines to switch said first and second MOS transistors such that data is sequentially read from and sequentially written to said data storage capacitors, wherein said first word line signal has a first signal level for switching said first MOS transistor ON, subsequently said second word line signal has a first signal level for switching said second MOS transistor ON, subsequently said second word line signal has a second signal level for switching said second MOS transistor OFF, and subsequently said first word line signal has a second signal level for switching said first MOS transistor OFF.

53. The semiconductor memory according to claims 1 or 45, wherein the second electrode of each of said data storage capacitors is connected to a predetermined potential.

54. The semiconductor memory according to claims 1 or 45, wherein:

each of said first and second MOS transistors has a drain region corresponding to said first terminal thereof, a source region corresponding to said second terminal thereof, and a channel region located between said drain and source regions, said drain, channel, and source regions of each of said first and second MOS transistors arranged linearly on a surface of a semiconductor substrate; and each of said first and second data storage capacitors has a storage electrode, an insulating film, and a plate electrode, said first data storage capacitor having a stack structure wherein said storage electrode of said first data storage capacitor contacts said source region of said first MOS transistor and said second data storage capacitor having a stack structure wherein said storage electrode of said second data storage capacitor contacts said source region of said second MOS transistor.

55. The semiconductor memory according to claims 1 or 45, wherein:

each of said first and second MOS transistors has a drain region corresponding to said first terminal thereof, a source region corresponding to said second terminal thereof, and a channel region located between said drain and source regions, said drain region of said first MOS transistor formed on an upper surface of a projection formed on a surface of a semiconductor substrate, said channel and source regions of said first MOS transistor formed on a side surface of said projection, and said drain, channel and source regions of said second MOS transistor formed on said side surface of said projection and located below said source region of said first MOS transistor; and each of said first and second data storage capacitors has a storage electrode, an insulating film, and a plate electrode, said storage electrode of said first data storage capacitor located on said side surface of said projection and extending continuously between said source region of said first MOS transistor and said drain region of said second MOS transistor and said storage electrode of said second data storage capacitor located on said side surface of said projection and extending continuously in said source region of said second MOS transistor.

56. The semiconductor memory according to claims 1 or 45, wherein the second electrode of each of said data storage capacitors receives a respective clock signal.

57. The semiconductor memory according to claims 1 or 45, further comprising:

a second data node;

a third MOS transistor having a first terminal connected to said second data node, a second terminal, and a gate connected to said gate of said first MOS transistor;

a fourth MOS transistor having a first terminal connected to said second terminal of said third MOS transistor, a second terminal, and a gate connected to said gate of said second MOS transistor wherein the first electrode of said first data storage capacitor is connected to said second terminal of said first MOS transistor and the second electrode of said first data storage capacitor is connected to said second terminal of said third MOS transistor, and the first electrode of said second data storage capacitor is connected to said second terminal of said second MOS transistor and the second electrode of said second data storage capacitor is connected to said second terminal of said fourth MOS transistor.

* * * * *